(12) United States Patent
Chan et al.

(10) Patent No.: US 11,367,718 B1
(45) Date of Patent: Jun. 21, 2022

(54) LAYOUT FOR MEASURING OVERLAPPING STATE

(71) Applicant: Winbond Electronics Corp., Taichung (TW)

(72) Inventors: Chi-Hung Chan, Taichung (TW); Chun-Chiao Tseng, Taichung (TW); Hung-Ming Su, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 17/124,390

(22) Filed: Dec. 16, 2020

(51) Int. Cl.
*H01L 27/02* (2006.01)
*H01L 21/66* (2006.01)
*H01L 27/108* (2006.01)

(52) U.S. Cl.
CPC .......... *H01L 27/0207* (2013.01); *H01L 22/12* (2013.01); *H01L 27/10814* (2013.01); *H01L 27/10823* (2013.01)

(58) Field of Classification Search
CPC .......... H01L 2223/544–54426; H01L 2223/54453–54466; H01L 23/544; H01L 22/00–12; H01L 22/20; H01L 22/30
See application file for complete search history.

(56) References Cited

U.S. PATENT DOCUMENTS

| | | | | |
|---|---|---|---|---|
| 10,943,838 | B2 * | 3/2021 | Hoo ........................ | G06F 30/39 |
| 2012/0149135 | A1 | 6/2012 | Sugimura et al. | |
| 2016/0093573 | A1 * | 3/2016 | Liou ...................... | H01L 23/544 |
| | | | | 438/8 |
| 2018/0342517 | A1 * | 11/2018 | Takesako .......... | H01L 23/53257 |
| 2019/0067204 | A1 * | 2/2019 | Sun ........................ | G01B 21/20 |
| 2019/0206802 | A1 * | 7/2019 | Dai ........................ | H01L 22/12 |
| 2020/0348587 | A1 * | 11/2020 | Mekking ............. | H01L 21/0274 |
| 2020/0388577 | A1 * | 12/2020 | Cheng ................... | H01L 23/544 |

FOREIGN PATENT DOCUMENTS

JP   2007139821   6/2007

* cited by examiner

*Primary Examiner* — Marcos D. Pizarro
*Assistant Examiner* — William Henry Anderson
(74) *Attorney, Agent, or Firm* — JCIPRNET (57) ABSTRACT

A layout for measuring an overlapping state includes a layout region, a first dummy active area region, and dummy component regions. The first dummy active area region is located in the layout region. The dummy component regions are stacked in the layout region. At the moment when one of the dummy component regions is formed on the first dummy active area region, the one of the dummy component regions and the first dummy active area region have a first overlapping region, and the first overlapping region does not include other dummy component regions among the dummy component regions.

14 Claims, 8 Drawing Sheets

LAYOUT FOR MEASURING OVERLAPPING STATE

BACKGROUND

Technical Field

The disclosure relates to a semiconductor layout, and particularly relates to a layout for measuring an overlapping state.

Description of Related Art

In current manufacturing processes of semiconductor devices (e.g., memory devices), as the arrangement of semiconductor devices becomes more and more compact, after the manufacturing process of some components in the semiconductor device is completed, it is difficult to directly measure the overlapping state (alignment state) with the component formed by the previous process, which results in delay in reflection of defects or decrease in the yields.

SUMMARY

The disclosure provides a layout for measuring an overlapping state, which may be used to effectively and instantly obtain an overlapping state between corresponding components in a semiconductor device.

The disclosure provides a layout for measuring an overlapping state, including a layout region, a first dummy active area region, and multiple dummy component regions. The first dummy active area region is located in the layout region. The dummy component regions are stacked in the layout region. At the moment when one of the dummy component regions is formed on the first dummy active area region, the one of the dummy component regions and the first dummy active area region have a first overlapping region, and the first overlapping region does not include other dummy component regions among the dummy component regions.

Based on the above, in the layout for measuring an overlapping state provided in the disclosure, at the moment when one of the dummy component regions is formed on the first dummy active area region, the one of the dummy component regions and the first dummy active area region have a first overlapping region, and the first overlapping region does not include other dummy component regions among the dummy component regions. Therefore, after the dummy component region is formed, it is possible to effectively and instantly measure the overlapping state between the dummy component in the dummy component region and the dummy active area in the first dummy active area region in the first overlapping region to thereby obtain the overlapping state between the corresponding active area and component in the semiconductor device. Accordingly, it is possible to instantly reflect defects, effectively improve the yields, and lower the production costs. In addition, by measuring the overlapping state of the layout, it is possible to avoid the adverse effects caused by directly measuring the device area of the product by a high-voltage electron beam.

To make the aforementioned more comprehensible, several embodiments accompanied with drawings are described in detail as follows.

DESCRIPTION OF THE EMBODIMENTS

Figure 1A:
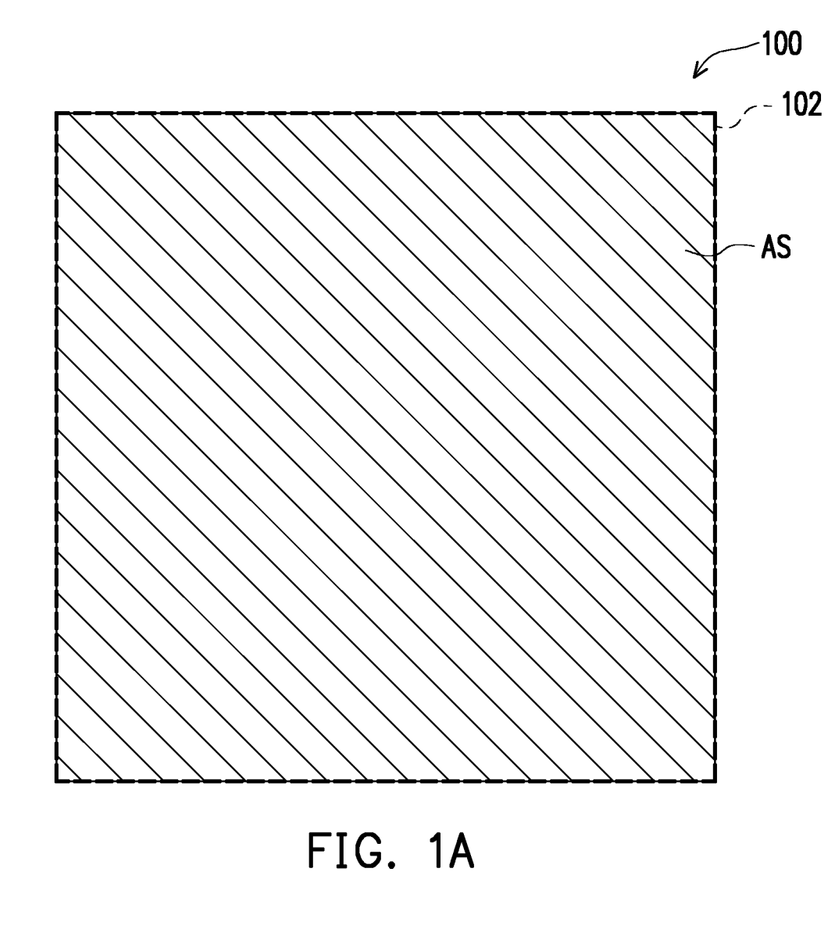
FIG. 1A to FIG. 1F are schematic views showing a stacking process of a layout for measuring an overlapping state according to an embodiment of the disclosure.
Figure 1B:
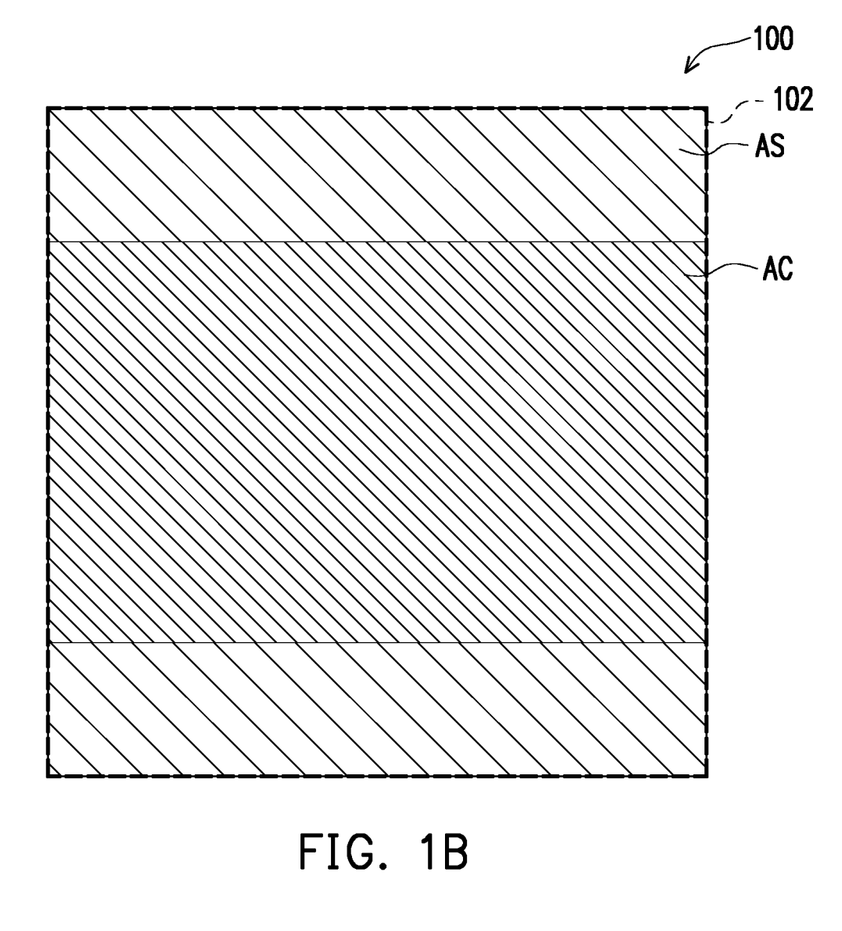
Figure 1C:
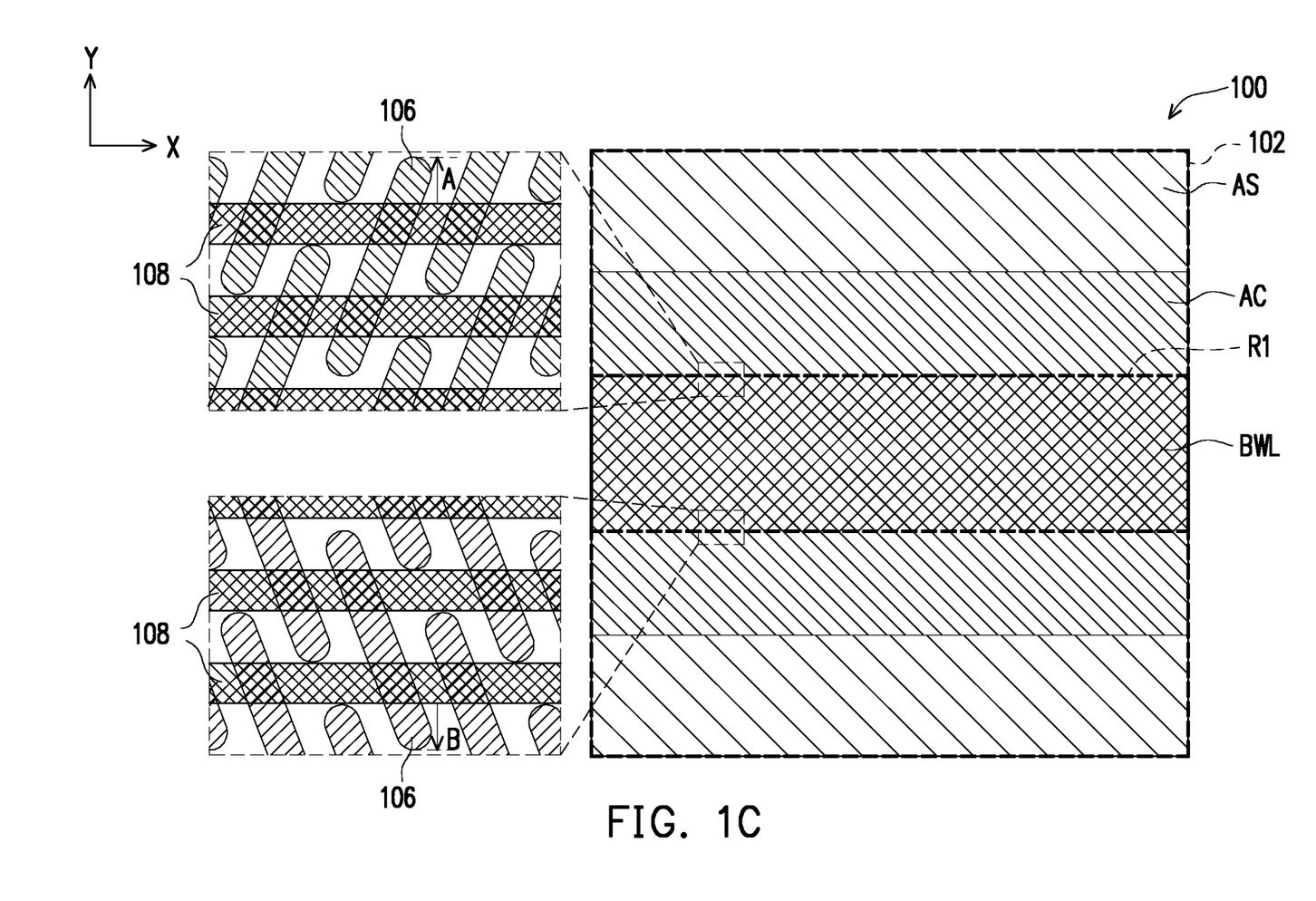
Figure 1D:
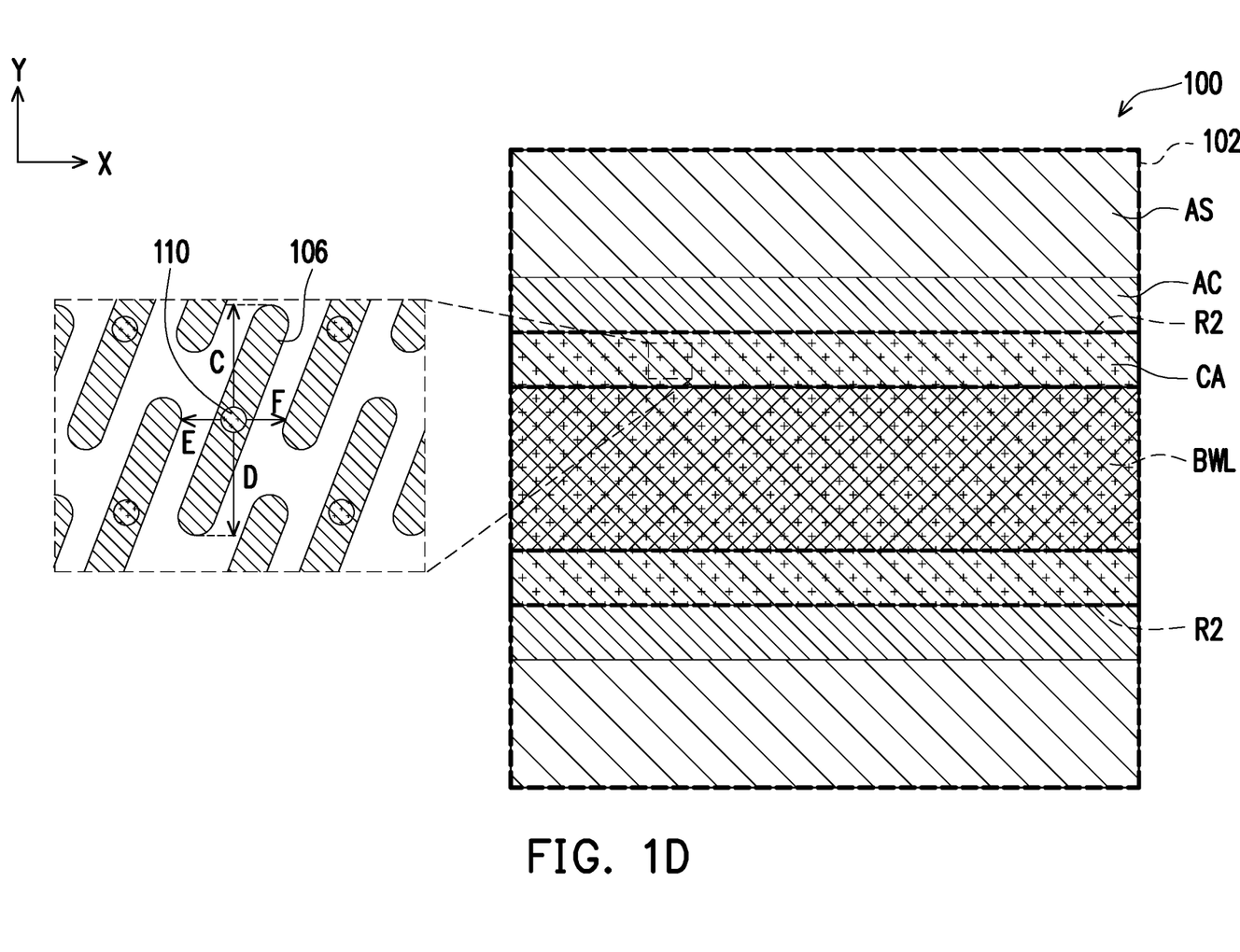
Figure 1E:
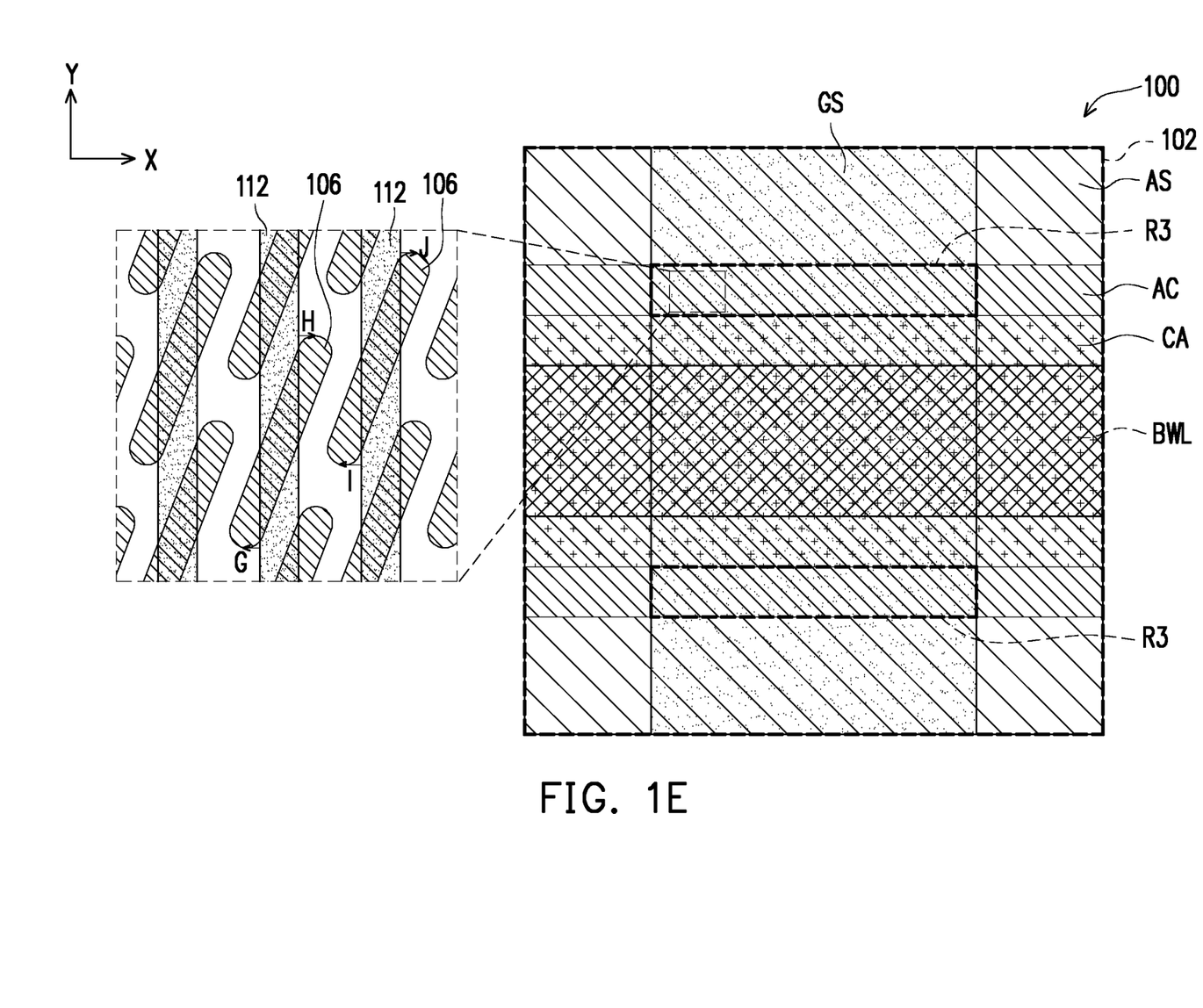

FIG. 1A to FIG. 1F are schematic views showing a stacking process of a layout for measuring an overlapping state according to an embodiment of the disclosure. FIG. 2 is a schematic view showing each region in the layout for measuring the overlapping state according to an embodiment of the disclosure. FIG. 3 is a schematic view showing components in the regions of FIG. 2.

Figure 1F:
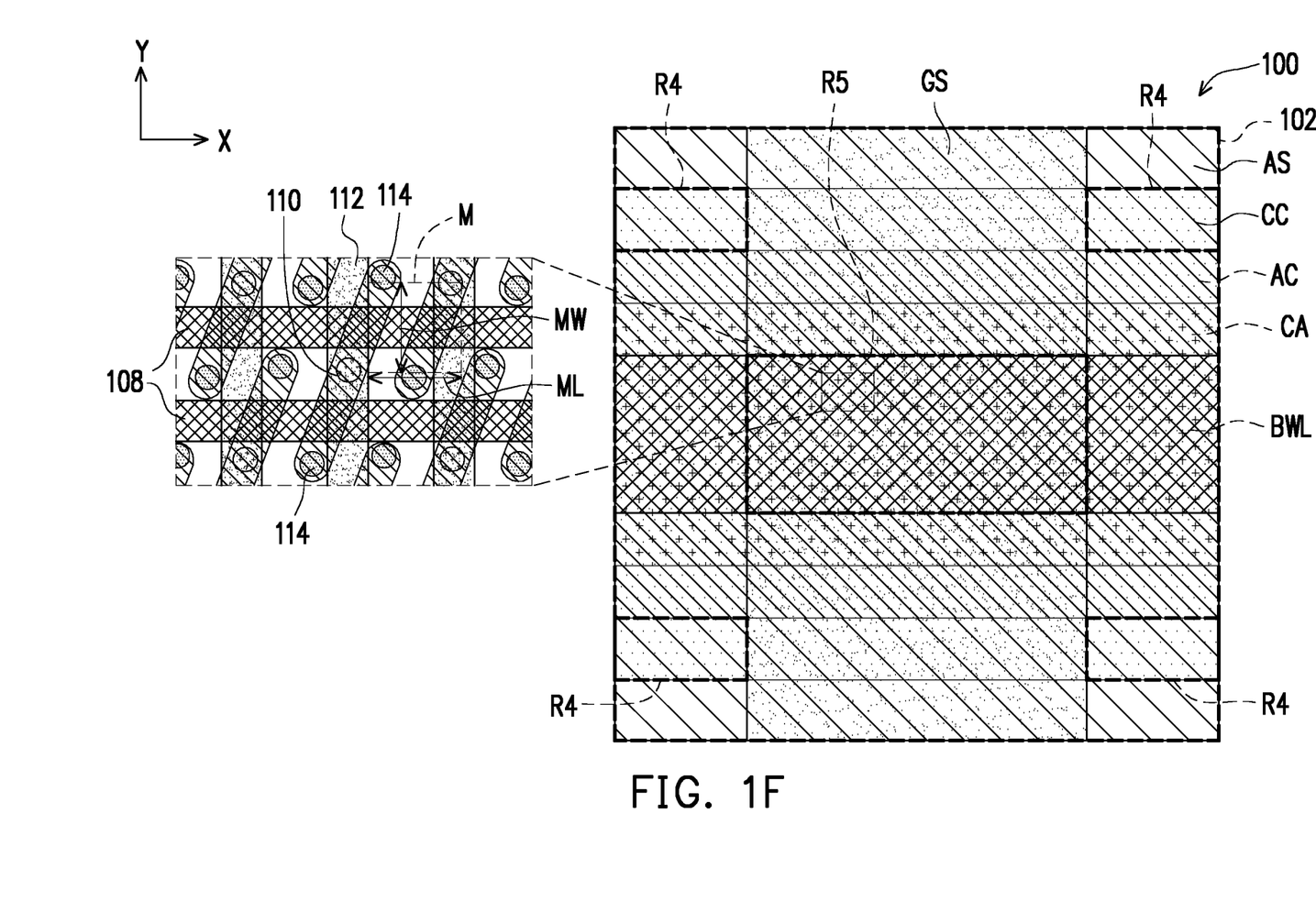
Figure 2:
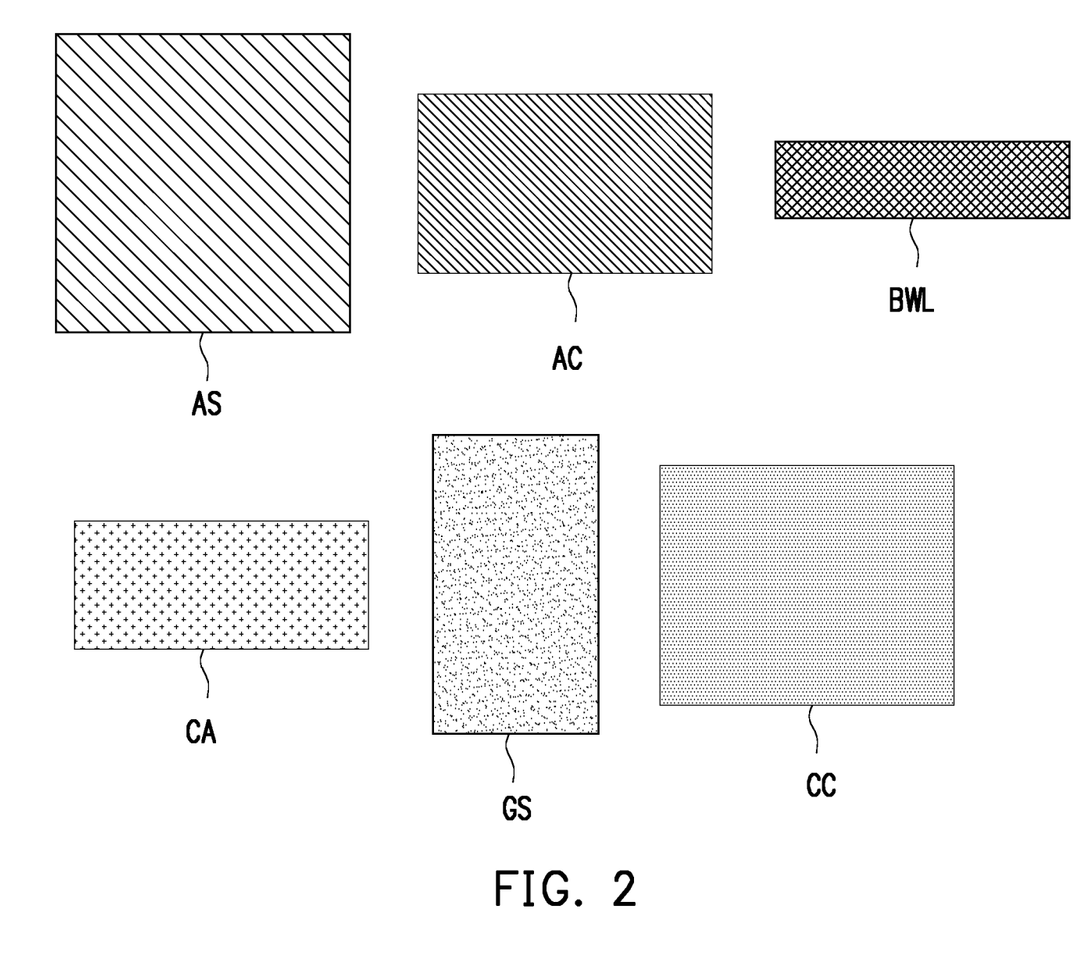
FIG. 2 is a schematic view showing each region in the layout for measuring the overlapping state according to an embodiment of the disclosure.
Figure 3:
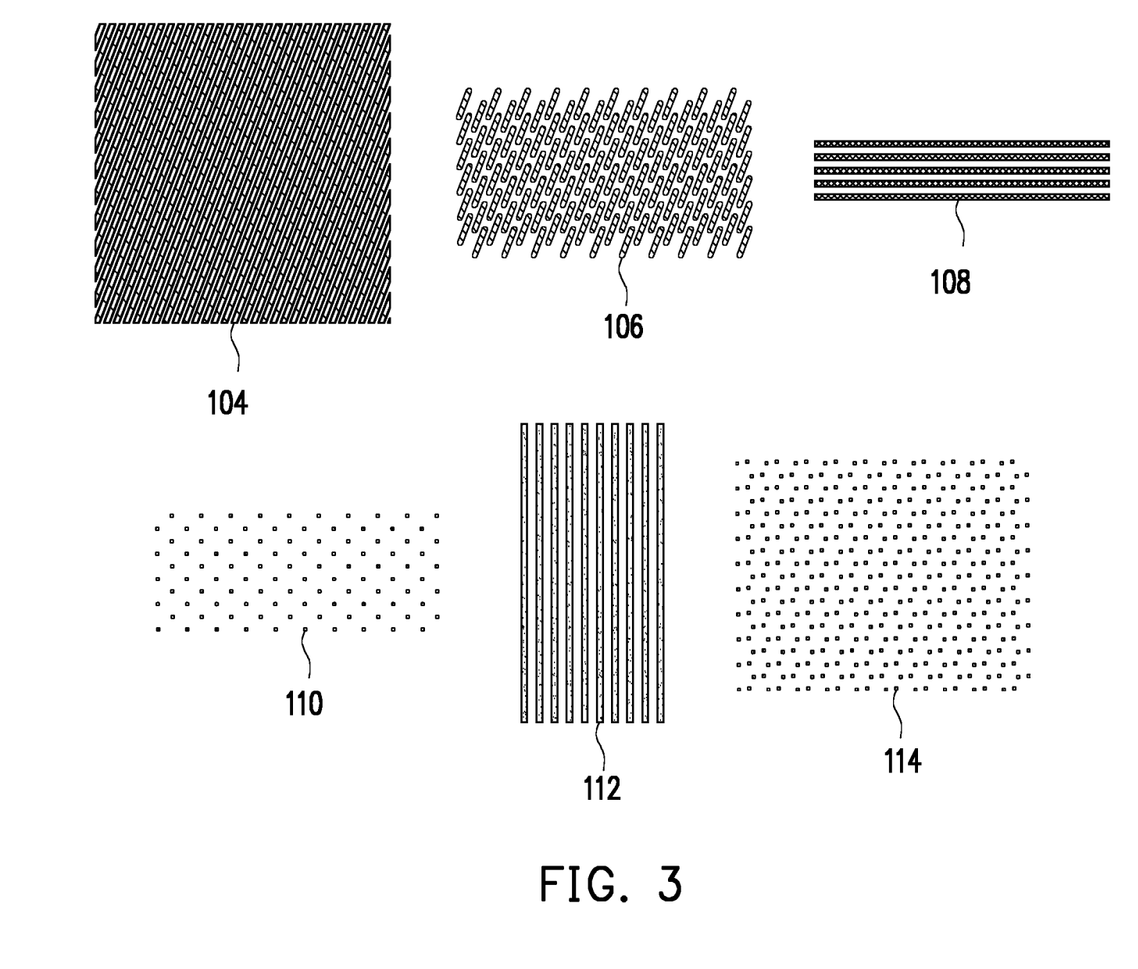
FIG. 3 is a schematic view showing components in the regions of FIG. 2.

Referring to FIG. 1F, FIG. 2, and FIG. 3, a layout 100 for measuring an overlapping state includes a layout region 102, a dummy active area region AC, and multiple dummy component regions. In addition, the layout 100 further includes at least one of a dummy active area region AS and a dummy capacitance contact region CC.

The layout 100 may be used to obtain an overlapping state between corresponding components in a semiconductor device. In this embodiment, as an example, the layout 100 is used to obtain an overlapping state between corresponding components in a memory device (e.g., a dynamic random access memory (DRAM)), but the disclosure is not limited thereto. The layout 100 may be located in a chip area or a scribe line of a wafer. In the wafer, the chip area and the scribe line are different regions. The chip area may include a semiconductor device area and a dummy area. The semiconductor device area (e.g., a memory device area) is a region for forming a semiconductor device which performs a device function (e.g., a storage function). The dummy area is a region for forming dummy components in the layout 100 and is not a region for performing a device function (e.g., a storage function). The dummy components in the layout 100 and the components in the semiconductor device (e.g., a memory device) may be formed simultaneously by the same manufacturing process. The layout region 102 may be located in the dummy area of the chip area or the scribe line.

Compared with the case where the layout 100 is disposed in the scribe line, in the case where the layout 100 is located in the chip area of the wafer, the environment of the layout 100 is more similar to the environment of the semiconductor device area. Therefore, when the layout 100 is used to obtain the overlapping state between the corresponding components in the semiconductor device, the overlapping state between the components in the semiconductor device can be more accurately reflected.

Referring to FIG. 1A, FIG. 2, and FIG. 3, the dummy active area region AS is located in the layout region 102. The dummy active area region AS may include multiple dummy active areas 104. The dummy active area 104 has a strip shape, for example. The dummy active areas 104 are arranged in a matrix, for example. The dummy active area 104 may be a part of the substrate (not shown). In addition, the dummy active area 104 may be defined in the substrate by an isolation structure (e.g., a shallow trench isolation structure).

Referring to FIG. 1B, FIG. 2, and FIG. 3, the dummy active area region AC is located in the layout region 102. The dummy active area region AC may be connected to the dummy active area region AS. The dummy active area region AC may include multiple dummy active areas 106. The dummy active area 106 has a strip shape, for example. The dummy active areas 106 are arranged in a matrix, for example. The dummy active areas 106 may be formed by cutting the dummy active areas 104. The length of the dummy active area 104 may be greater than the length of the dummy active area 106. The dummy active area 104 may be a part of the substrate (not shown). In addition, the dummy active areas 106 may be formed by cutting the dummy active areas 104 by an isolation structure (e.g., a shallow trench isolation structure).

Referring to FIG. 1C to FIG. 1E, multiple dummy component regions are stacked in the layout region 102. In this embodiment, the dummy component regions may be selected from the group consisting of a dummy buried word line region BWL, a dummy bit line contact region CA, and a dummy bit line region GS. At the moment when one of the dummy component regions is formed on the dummy active area region AC, the one of the dummy component regions and the dummy active area region AC have an overlapping region, and the overlapping region does not include other dummy component regions among the dummy component regions. Accordingly, it is possible to effectively and instantly measure the overlapping state between the corresponding components in the semiconductor device. In some embodiments, at the moment when each dummy component region is formed on the dummy active area region AC, each dummy component region and the dummy active area region AC may have an overlapping region, and the overlapping region does not include other dummy component regions among the dummy component regions. Examples will be described as follows.

Referring to FIG. 1C, FIG. 2, and FIG. 3, the dummy buried word line region BWL may be located in the dummy active area region AC. The dummy buried word line region BWL may be stacked on the dummy active area region AC. In other words, after the dummy active area region AC is formed, the dummy buried word line region BWL is then formed. The dummy buried word line region BWL may be smaller than the dummy active area region AC. The dummy buried word line region BWL may include multiple dummy buried word lines 108. The dummy buried word line 108 may be buried in the substrate. The dummy buried word line 108 has a strip shape, for example. The dummy buried word lines 108 are arranged in a matrix, for example.

At the moment when the dummy buried word line region BWL is formed on the dummy active area region AC, the dummy buried word line region BWL and the dummy active area region AC have an overlapping region R1, and the overlapping region R1 does not include other dummy component regions among the dummy component regions. Accordingly, after the buried word line in the memory device and the dummy buried word line 108 in the layout 100 are simultaneously formed, it is possible to effectively and instantly measure the overlapping state between the dummy buried word line 108 and the dummy active area 106 at the boundary of the overlapping region R1 without being affected by the dummy components in other dummy component regions. As a result, the overlapping state between the corresponding buried word line and active area in the memory device can be obtained.

For example, referring to the enlarged view in FIG. 1C, a distance A and a distance B by which the corresponding dummy active areas 106 protrude from the dummy buried word lines 108 in the Y direction are respectively measured at two opposite boundaries of the overlapping region R1. The difference between the distance A and the distance B is the overlay shift of the dummy buried word line 108 and the dummy active area 106 in the Y direction (i.e., overlay shift=A−B).

Referring to FIG. 1D, FIG. 2, and FIG. 3, the dummy bit line contact region CA may be located in the dummy active area region AC. The dummy bit line contact region CA may be stacked on the dummy buried word line region BWL. In other words, after the dummy buried word line region BWL is formed, the dummy bit line contact region CA is then formed. The dummy bit line contact region CA may be smaller than the dummy active area region AC and larger than the dummy buried word line region BWL. The dummy bit line contact region CA may include multiple dummy bit line contacts 110. The shape of the dummy bit line contact 110 is, for example, a circle or a rectangle. The dummy bit line contacts 110 are arranged in a matrix, for example.

At the moment when the dummy bit line contact region CA is formed on the dummy active area region AC, the dummy bit line contact region CA and the dummy active area region AC have an overlapping region R2, and the overlapping region R2 does not include other dummy component regions (e.g., the dummy buried word line region BWL) among the dummy component regions. Accordingly, after the bit line contact in the memory device and the dummy bit line contact 110 in the layout 100 are simultaneously formed, it is possible to effectively and instantly measure the overlapping state between the dummy bit line contact 110 and the dummy active area 106 in the overlapping region R2 without being affected by the dummy components in other dummy component regions. As a result, the overlapping state between the corresponding bit line contact and active area in the memory device can be obtained.

For example, referring to the enlarged view in FIG. 1D, in the overlapping region R2, a minimum distance C and a minimum distance D between the dummy bit line contact 110 and two ends of the dummy active area 106 in the Y direction are measured, and a minimum distance E and a minimum distance F between the dummy bit line contact 110 and the dummy active areas 106 on its two sides in the X direction are measured. The difference between the minimum distance C and the minimum distance D is the overlay shift of the dummy bit line contact 110 and the dummy active area 106 in the Y direction (i.e., overlay shift (Y direction)=C−D). The difference between the minimum distance E and the minimum distance F is the overlay shift of the dummy bit line contact 110 and the dummy active area 106 in the X direction (i.e., overlay shift (X direction)=E−F).

Referring to FIG. 1E, FIG. 2, and FIG. 3, the dummy bit line region GS may intersect with the dummy active area region AC, the dummy bit line contact region CA, and the dummy buried word line region BWL. The dummy bit line region GS may be stacked on the dummy bit line contact region CA. In other words, after the dummy bit line contact region CA is formed, the dummy bit line region GS is then formed. The dummy bit line region GS may include multiple dummy bit lines 112. The dummy bit line 112 has a strip shape, for example. The dummy bit lines 112 are arranged in a matrix, for example.

At the moment when the dummy bit line region GS is formed on the dummy active area region AC, the dummy bit line region GS and the dummy active area region AC have an overlapping region R3, and the overlapping region R3 does not include other dummy component regions (e.g., the dummy buried word line region BWL and the dummy bit line contact region CA) among the dummy component regions. Accordingly, after the bit line in the memory device and the dummy bit line 112 in the layout 100 are simultaneously formed, it is possible to effectively and instantly measure the overlapping state between the dummy bit line 112 and the dummy active area 106 in the overlapping region R3 without being affected by the dummy components in other dummy component regions. As a result, the overlapping state between the corresponding bit line and active area in the memory device can be obtained.

For example, referring to the enlarged view in FIG. 1E, in the overlapping region R3, a minimum distance G and a minimum distance H between the dummy bit line 112 and two ends of the dummy active area 106 in the X direction are measured. The difference between the minimum distance G and the minimum distance H is the overlay shift of the dummy bit line 112 and the dummy active area 106 in the X direction (i.e., overlay shift=G−H). In addition, in the case where the dummy bit line 112 is formed by a self-alignment double patterning (SADP) process, the overlay shift of the dummy bit line 112 and the dummy active area 106 in the X direction may be the average value of the overlay shifts calculated based on two adjacent dummy bit lines 112 (i.e., overlay shift=[(G−H)+(I−J)]/2).

Referring to FIG. 1F, FIG. 2, and FIG. 3, the dummy capacitance contact region CC is located in the layout region 102. The dummy capacitance contact region CC may be stacked on the dummy bit line region GS. In other words, after the dummy bit line region GS is formed, the dummy capacitance contact region CC is then formed. The dummy capacitance contact region CC may be larger than the dummy active area region AC. The dummy capacitance contact region CC may include multiple dummy capacitance contacts 114. The shape of the dummy capacitance contact 114 is, for example, a circle or a rectangle. The dummy capacitance contacts 114 are arranged in a matrix, for example.

At the moment when the dummy capacitance contact region CC is formed in the layout region 102, an overlapping region R4 does not include the above dummy component regions (e.g., the dummy buried word line region BWL, the dummy bit line contact region CA, and the dummy bit line region GS) and the dummy active area region AC. As a result, in the overlapping region R4, the adjacent dummy capacitance contacts 114 will have a short-circuit defect, and the short-circuit defect may be used in a sensitivity test of a defect inspection program.

Referring to the enlarged view in FIG. 1F, in an overlapping region R5 of the dummy capacitance contact region CC, the dummy bit line region GS, the dummy bit line contact region CA, the dummy buried word line region BWL, and the dummy active area region AC, two dummy buried word lines 108 may extend in the X direction and pass through the dummy active area 106. One dummy bit line 112 may extend in the Y direction and pass through the dummy active area 106. The dummy bit line 112 may be electrically connected to a doped area in the dummy active area 106 via the dummy bit line contact 110. The dummy capacitance contact 114 is located above two ends of the dummy active area 106 and is electrically connected to other doped areas in the dummy active area 106. In this embodiment, if one half of the minimum spacing between components is set as F, then a length ML of a memory cell M is about 3F (i.e., 1.5 times the spacing of the dummy active areas 106) and a width MW is about 2F (i.e., 1 time the spacing of the dummy buried word lines 108), and the area of the memory cell M is about $6F^2$ (=3F×2F).

In addition, the semiconductor device may further include other components well known to those skilled in the art (e.g., capacitors and/or contacts (which may be electrically connected between the capacitors and the capacitance contacts)) and a dielectric layer, and the layout 100 may further include corresponding components (e.g., dummy capacitors and/or dummy contacts (which may be electrically connected between the dummy capacitors and the dummy capacitance contacts 114)) and a dielectric layer, and the descriptions thereof are omitted herein.

Based on the above embodiment, in the layout 100 for measuring the overlapping state, at the moment when one of the dummy component regions (e.g., the dummy buried word line region BWL, the dummy bit line contact region CA, and the dummy bit line region GS) is formed on the dummy active area region AC, the one of the dummy component regions and the dummy active area region AC have an overlapping region, and the overlapping region does not include other dummy component regions among the dummy component regions. Therefore, after the dummy component region is formed, it is possible to effectively and instantly measure the overlapping state between the dummy active area 106 in the dummy active area region AC and the dummy component (e.g., the dummy buried word line 108, the dummy bit line contact 110, or the dummy bit line 112) in the dummy component region in the overlapping region to thereby obtain the overlapping state between the corresponding active area and component in the semiconductor device. Accordingly, it is possible to instantly reflect defects, effectively improve the yields, and lower the production costs. In addition, by measuring the overlapping state of the layout 100, it is possible to avoid the adverse effects caused by directly measuring the device area of the product by a high-voltage electron beam.

In summary of the above, with the layout for measuring the overlapping state in the above embodiment, it is possible to measure the overlapping state between the dummy active area in the dummy active area region and the dummy component in the dummy component region to be measured without being affected by the dummy components in other dummy component regions. Therefore, it is possible to effectively and instantly obtain the overlapping state between the corresponding components in the semiconductor device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A layout for measuring an overlapping state, comprising:
 a layout region;
 a first dummy active area region located in the layout region; and
 multiple dummy component regions stacked in the layout region, wherein
 at the moment when one of the dummy component regions is formed on the first dummy active area region, the one of the dummy component regions and the first dummy active area region have a first overlapping region, and the first overlapping region does not comprise other dummy component regions among the dummy component regions, wherein
 the dummy component regions are selected from a group consisting of a dummy buried word line region, a dummy bit line contact region, and a dummy bit line region, the dummy buried word line region is located in the first dummy active area region, and the dummy buried word line region is smaller than the first dummy active area region.

2. The layout for measuring an overlapping state according to claim 1, wherein at the moment when each of the dummy component regions is formed on the first dummy active area region, each of the dummy component regions and the first dummy active area region have the first overlapping region, and the first overlapping region does not comprise other dummy component regions among the dummy component regions.

3. The layout for measuring an overlapping state according to claim 1, wherein the dummy bit line contact region is located in the first dummy active area region, and the dummy bit line contact region is smaller than the first dummy active area region and larger than the dummy buried word line region.

4. The layout for measuring an overlapping state according to claim 3, wherein the dummy bit line region intersects with the first dummy active area region, the dummy bit line contact region, and the dummy buried word line region.

5. The layout for measuring an overlapping state according to claim 1, wherein the dummy buried word line region comprises multiple dummy buried word lines, wherein a shape of the dummy buried word lines comprises a strip shape, and the dummy buried word lines are arranged in a matrix.

6. The layout for measuring an overlapping state according to claim 1, wherein the dummy bit line contact region comprises multiple dummy bit line contacts, wherein a shape of the dummy bit line contacts comprises a circle or a rectangle, and the dummy bit line contacts are arranged in a matrix.

7. The layout for measuring an overlapping state according to claim 1, wherein the dummy bit line region comprises multiple dummy bit lines, wherein a shape of the dummy bit lines comprises a strip shape, and the dummy bit lines are arranged in a matrix.

8. The layout for measuring an overlapping state according to claim 1, wherein the first dummy active area region comprises multiple first dummy active areas, wherein a shape of the first dummy active areas comprises a strip shape, and the first dummy active areas are arranged in a matrix.

9. The layout for measuring an overlapping state according to claim 1, wherein the layout is located in a chip area of a wafer.

10. A layout for measuring an overlapping state, comprising:
   a layout region;
   a first dummy active area region located in the layout region;
   a second dummy active area region located in the layout region, wherein the first dummy active area region is connected to the second dummy active area region; and
   multiple dummy component regions stacked in the layout region, wherein
   at the moment when one of the dummy component regions is formed on the first dummy active area region, the one of the dummy component regions and the first dummy active area region have a first overlapping region, and the first overlapping region does not comprise other dummy component regions among the dummy component regions.

11. The layout for measuring an overlapping state according to claim 10, wherein the second dummy active area region comprises multiple second dummy active areas, and a length of the second dummy active areas is greater than a length of the first dummy active areas.

12. The layout for measuring an overlapping state according to claim 11, wherein the first dummy active areas are formed by cutting the second dummy active areas, wherein a shape of the second dummy active areas comprises a strip shape, and the second dummy active areas are arranged in a matrix.

13. The layout for measuring an overlapping state according to claim 10, further comprising:
   a dummy capacitance contact region located in the layout region, wherein the dummy capacitance contact region and the second dummy active area region have a second overlapping region, and
   at the moment when the dummy capacitance contact region is formed in the layout region, the second overlapping region does not comprise the dummy component regions and the first dummy active area region.

14. The layout for measuring an overlapping state according to claim 10, wherein the first dummy active area region comprises multiple first dummy active areas, wherein a shape of the first dummy active areas comprises a strip shape, and the first dummy active areas are arranged in a matrix.

* * * * *